United States Patent
Aram et al.

(10) Patent No.: US 6,987,634 B1
(45) Date of Patent: *Jan. 17, 2006

(54) WRITE CHANNEL HAVING A PREAMPLIFIER AND A NON-UNIFORM TRANSMISSION LINE

(75) Inventors: Farbod Aram, Cupertino, CA (US); Leechung Yiu, Fremont, CA (US); Sehat Sutardja, Cupertino, CA (US)

(73) Assignee: Marvell International Ltd., Hamilton Hm 12 (BM)

(*) Notice: Subject to any disclaimer, the term of this patent is extended or adjusted under 35 U.S.C. 154(b) by 0 days.

This patent is subject to a terminal disclaimer.

(21) Appl. No.: 10/921,810

(22) Filed: Aug. 20, 2004

Related U.S. Application Data

(63) Continuation of application No. 10/051,550, filed on Jan. 18, 2002, now Pat. No. 6,798,597.

(60) Provisional application No. 60/265,578, filed on Feb. 2, 2001.

(51) Int. Cl.
  G11B 5/02  (2006.01)
  G11B 5/09  (2006.01)
  H03H 7/38  (2006.01)
(52) U.S. Cl. ............................ 360/68; 360/46; 360/67; 333/34

(58) Field of Classification Search .................. 333/32, 333/33, 34, 35; 360/128, 244.1, 46, 67, 68
See application file for complete search history.

(56) References Cited

U.S. PATENT DOCUMENTS

| | | | |
|---|---|---|---|
| 5,608,591 A * | 3/1997 | Klaassen | 360/245.9 |
| 5,822,141 A | 10/1998 | Chung et al. | |
| 5,880,626 A | 3/1999 | Dean | |
| 5,903,414 A * | 5/1999 | Kawase | 360/110 |
| 5,939,940 A | 8/1999 | Patti | |
| 6,040,954 A | 3/2000 | Tanghe | |
| 6,107,873 A | 8/2000 | Lorenz | |
| 6,175,463 B1 | 1/2001 | Nayebi et al. | |
| 6,185,057 B1 | 2/2001 | Masenas | |
| 6,798,597 B1 * | 9/2004 | Aram et al. | 360/68 |

* cited by examiner

Primary Examiner—David Hudspeth
Assistant Examiner—Daniell L. Negrón

(57) ABSTRACT

A high-speed transmission circuit includes an inductive head. The high-speed transmission circuit also includes a non-uniform transmission line having a variable characteristic impedance. The non-uniform transmission line is coupled between the inductive head and an endpoint node such that pulses are conducted over the non-uniform transmission line. The variable characteristic impedance is greater near the inductive head than near the endpoint node.

90 Claims, 8 Drawing Sheets

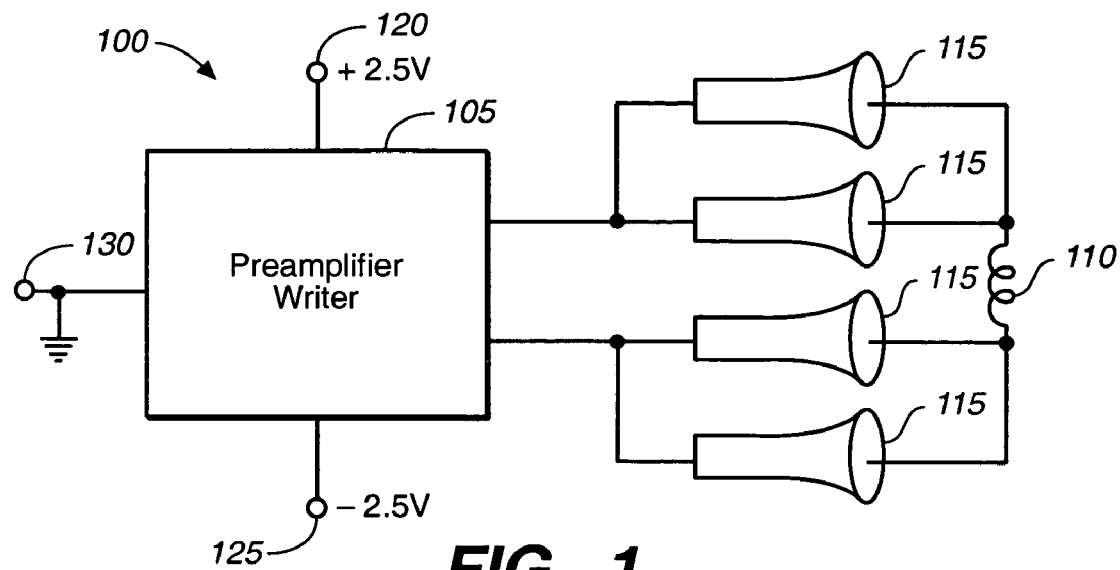
FIG._1
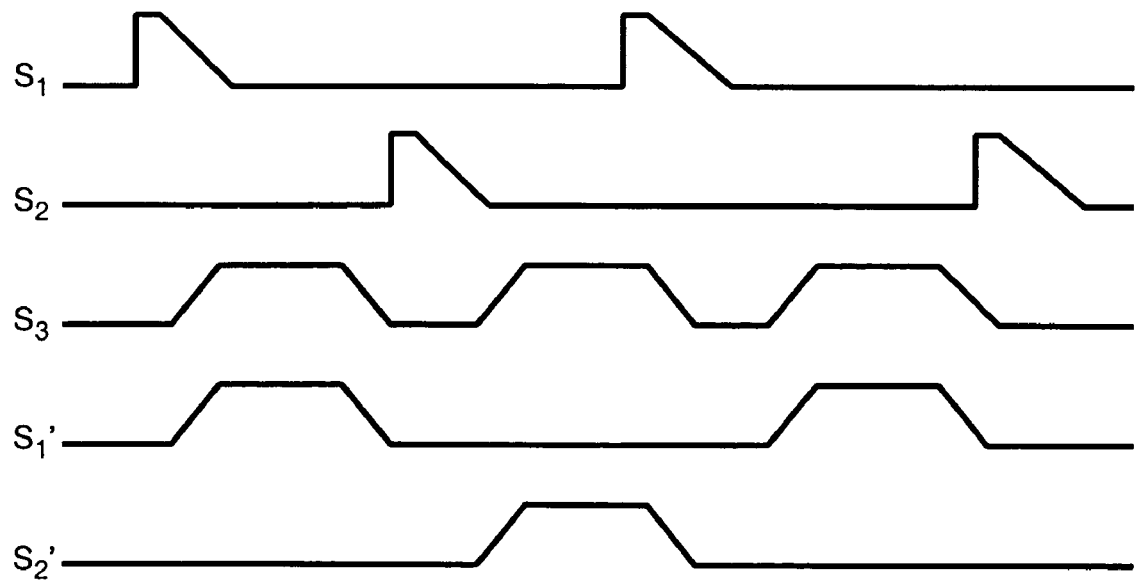
FIG._3

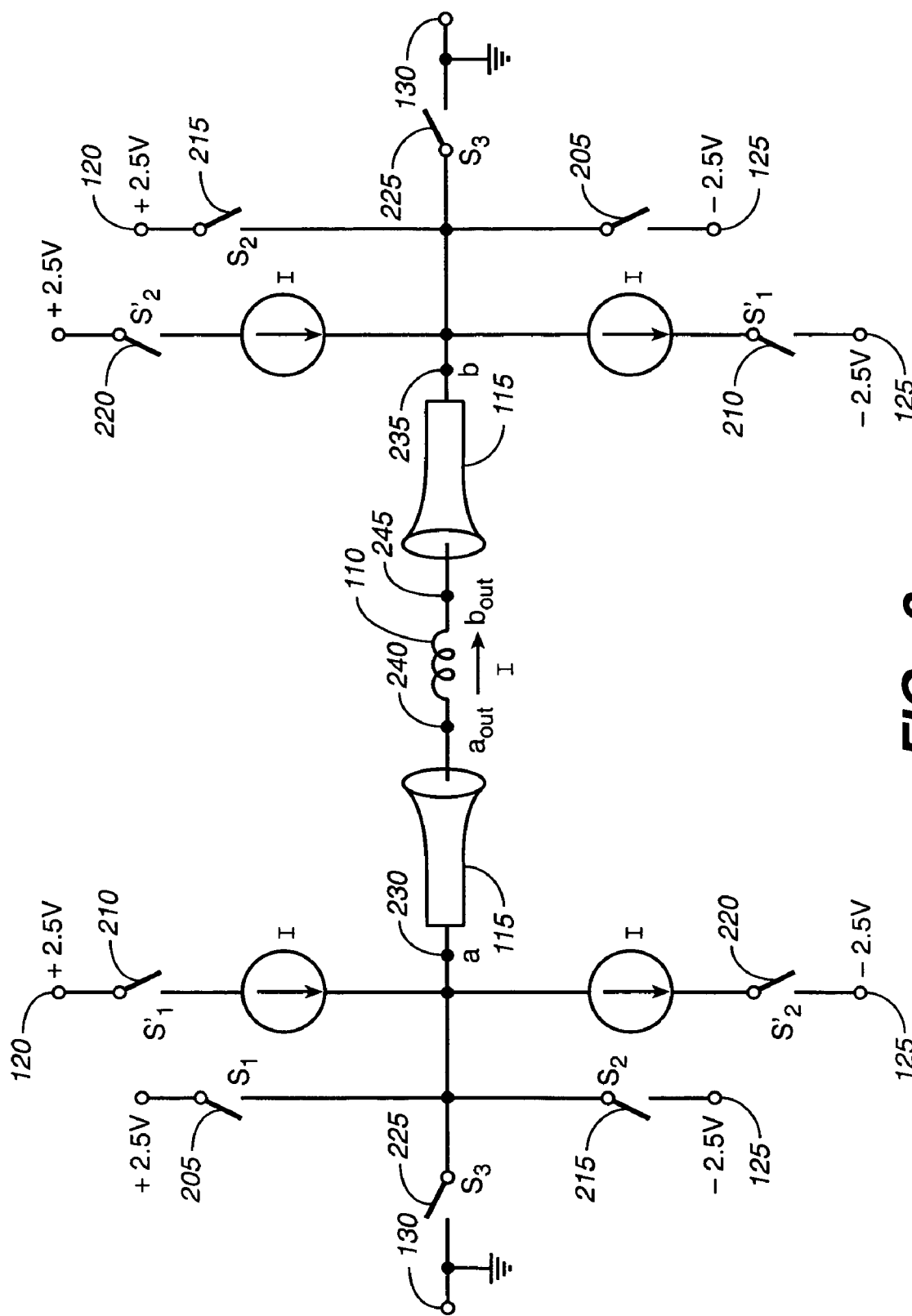
FIG._2

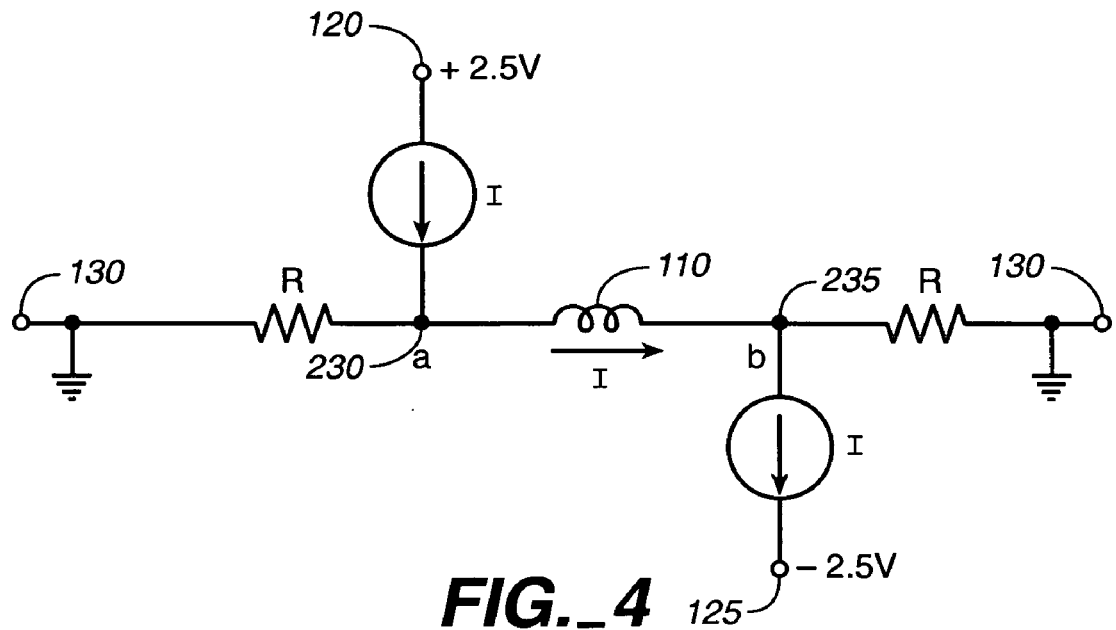
FIG._4
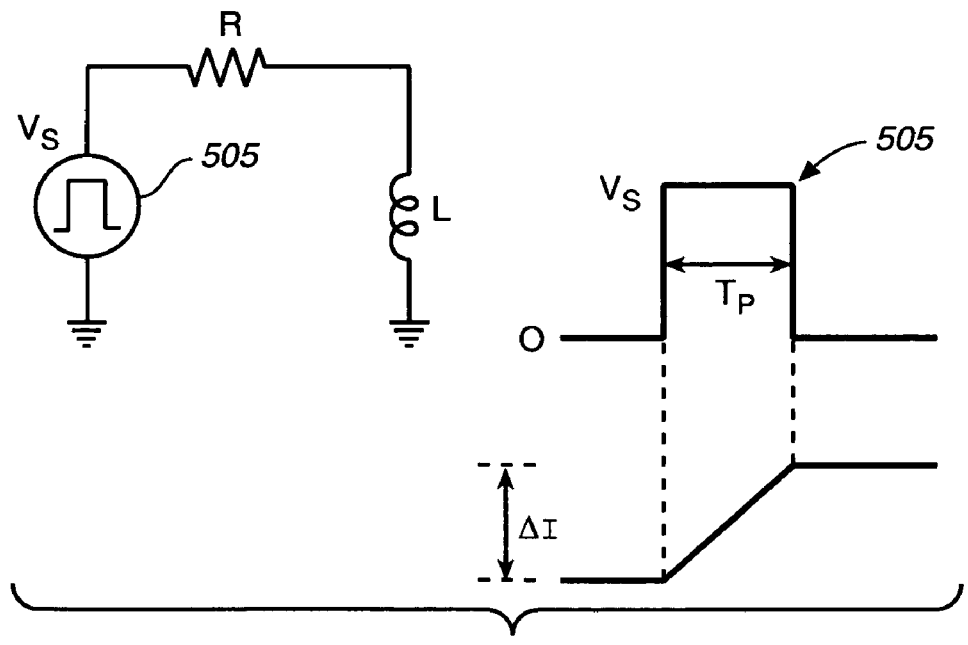
FIG._5

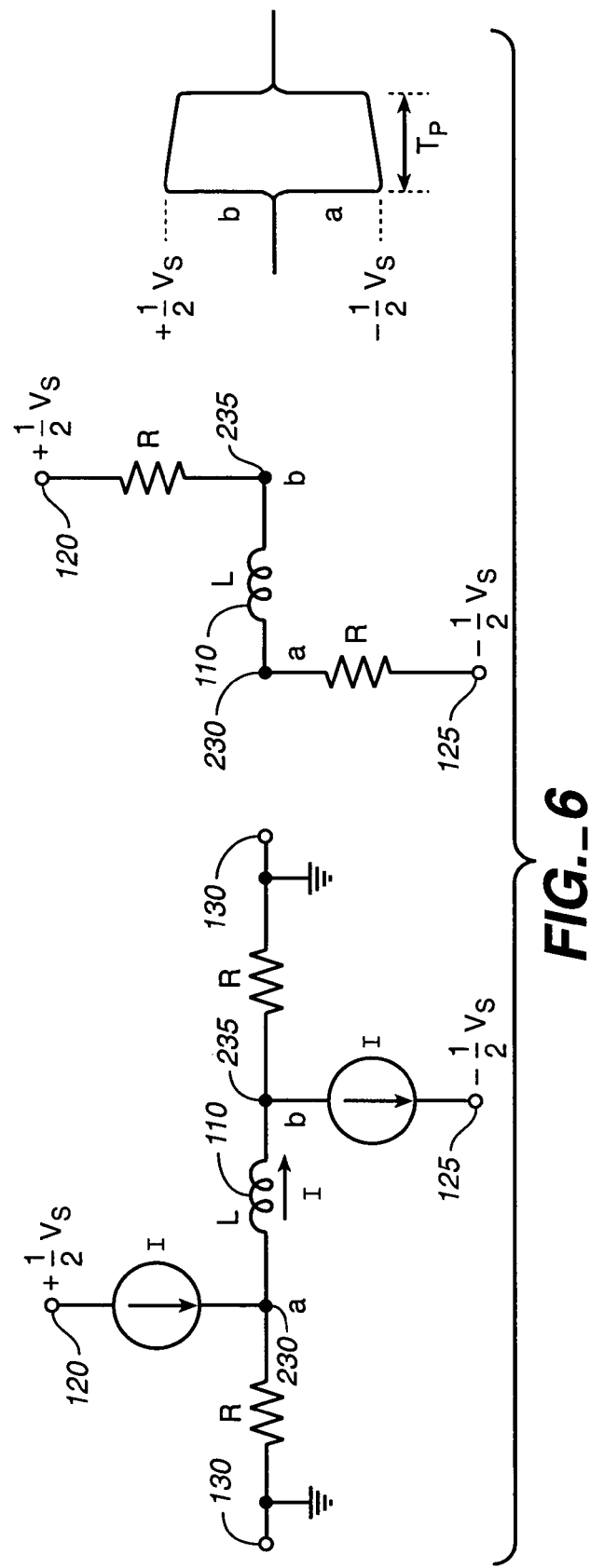
FIG._6

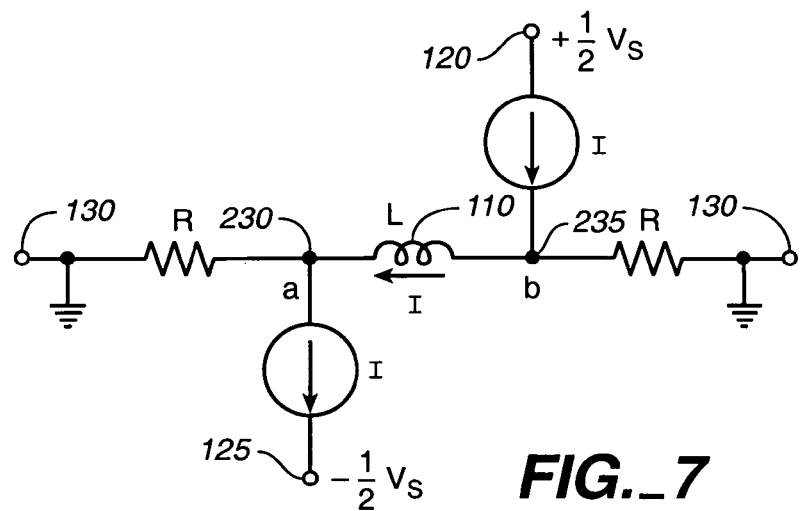
FIG._7
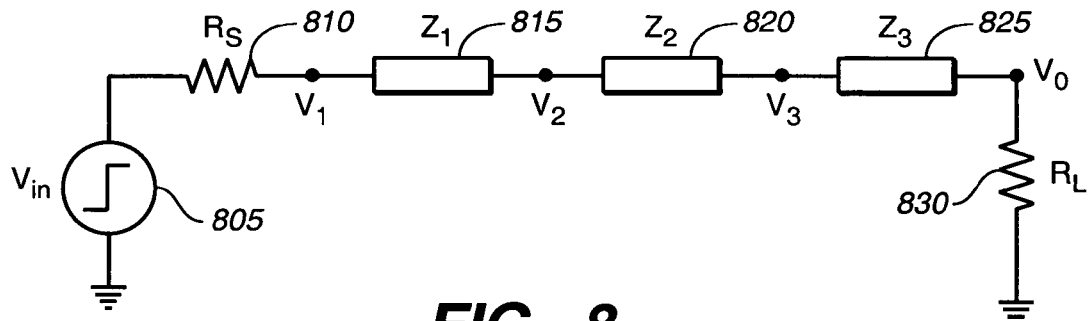
FIG._8
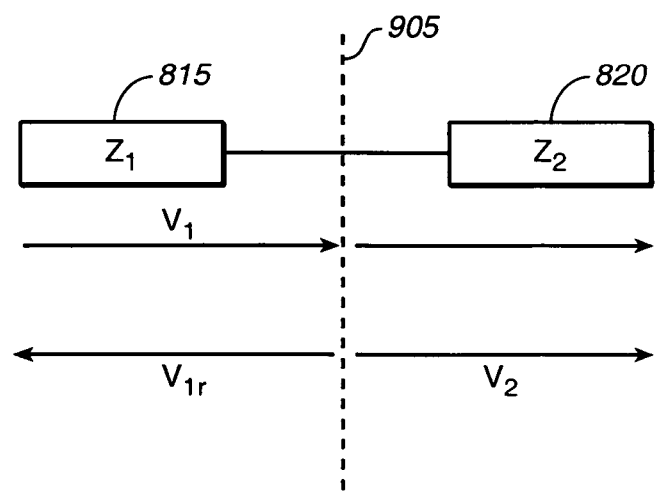
FIG._9

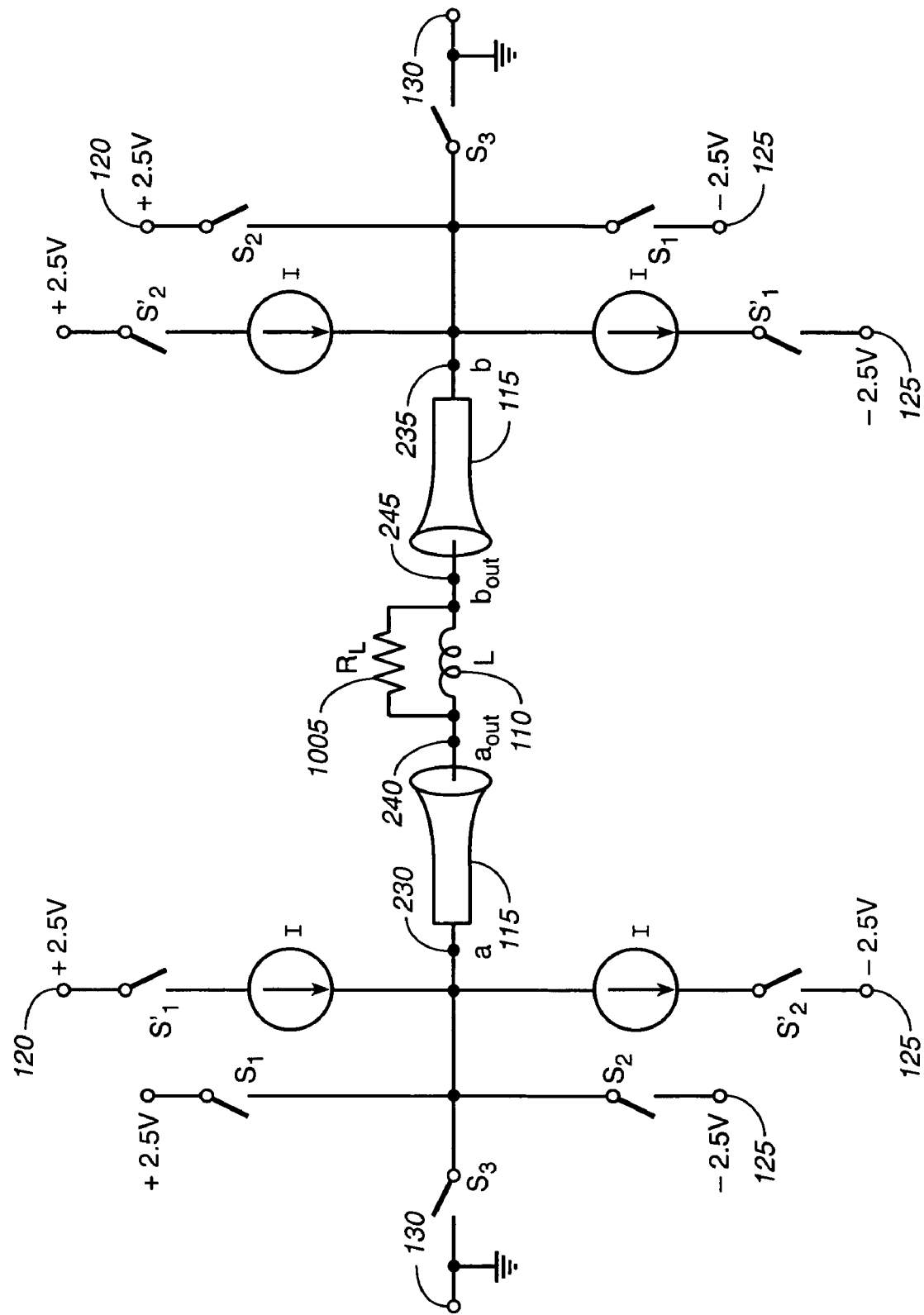
FIG._10

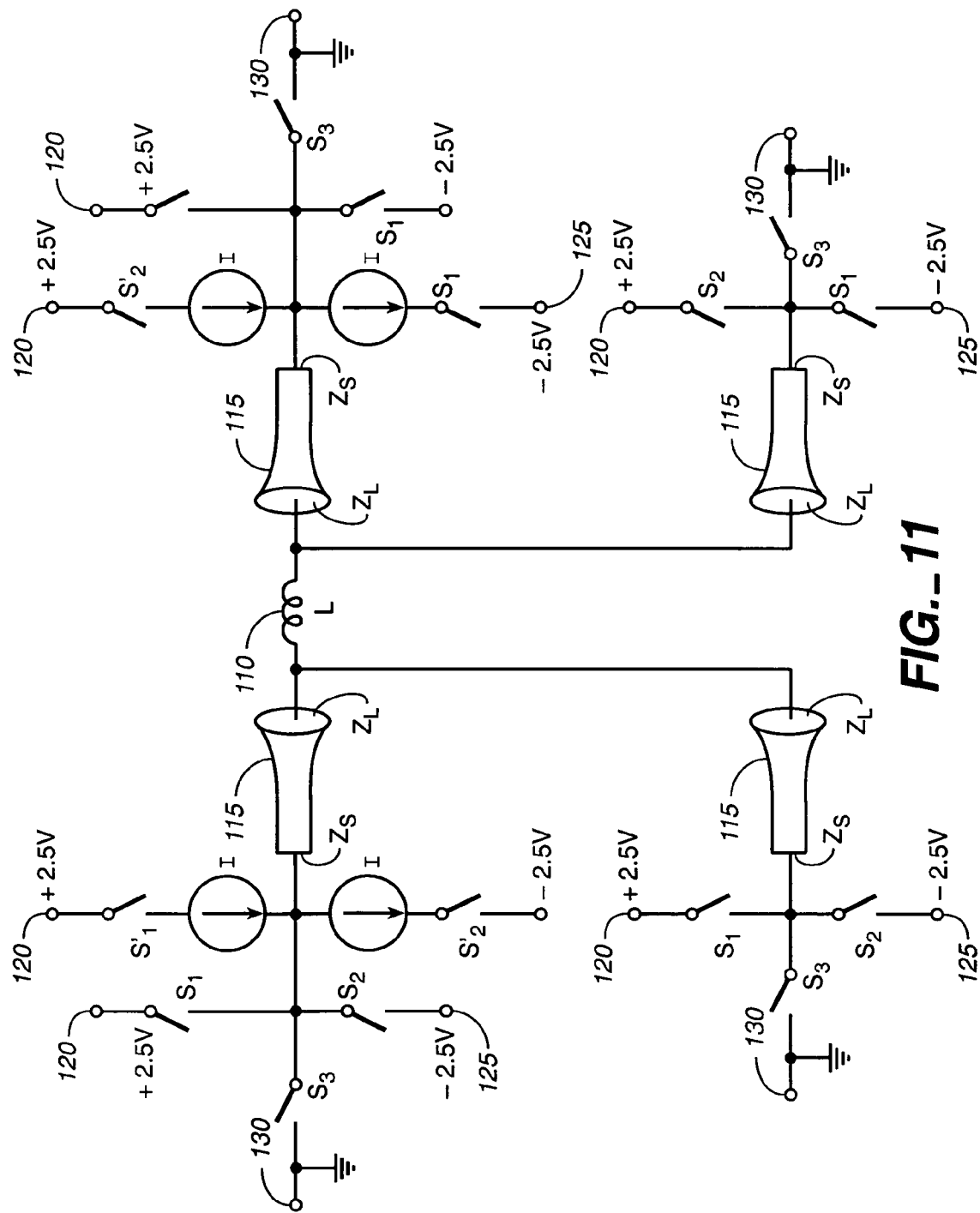
FIG._11

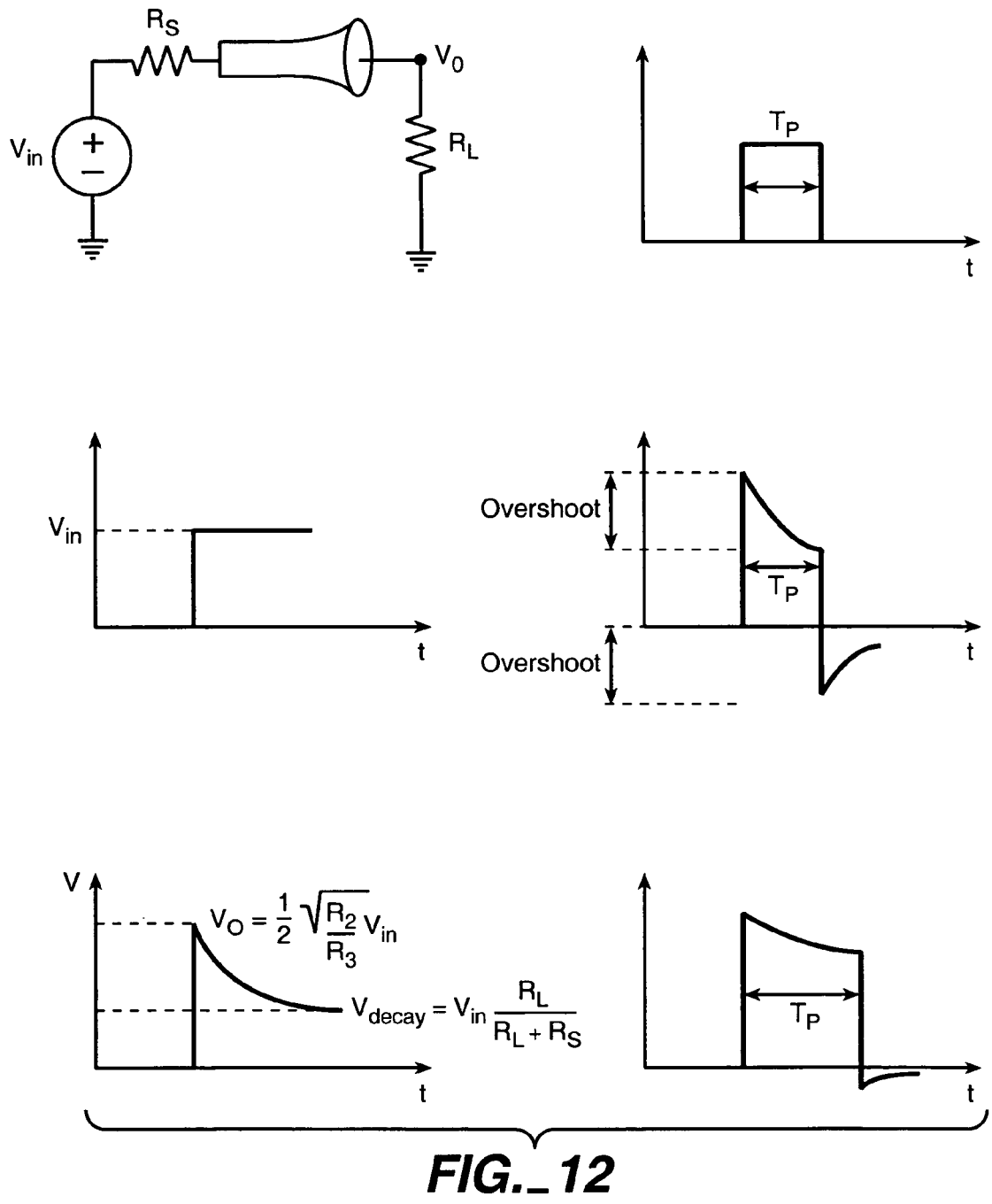
FIG._12

US 6,987,634 B1

WRITE CHANNEL HAVING A PREAMPLIFIER AND A NON-UNIFORM TRANSMISSION LINE

This application is a continuation of U.S. application Ser. No. 10/051,550, filed Jan. 18, 2002, now U.S. Pat. No. 6,798,597, which claims priority under 35 U.S.C. § 119(e) to U.S. Provisional Application Ser. No. 60/265,578, entitled "Preamplifier Writer", filed Feb. 2, 2001, the contents of each of which are incorporated by reference herein.

BACKGROUND OF THE INVENTION

1. Field of the Invention

The present invention relates to an apparatus and a method for transmitting digital data at high speed over a transmission channel, and preferably for writing to a hard disk drive at high operating speeds.

2. Description of the Related Art

A hard disk drive uses a recording head to receive data from a device that writes, or transmits, the data. Typically, the data propagates from the writer to the head via a transmission line. The data is transmitted in the form of electrical pulses, where each electrical pulses can be characterized by a pulse width which is measured in seconds. The transmission rate of the data is an important circuit characteristic, because a higher transmission rate allows for a larger volume of information to be communicated. Therefore, a common objective of circuit designers is to increase the maximum data transmission rate. Typically, the transmitted pulse is also amplified before it is received. Thus, if there is any signal interference prior to amplification, the received signal may be distorted. Therefore, another common objective of circuit designers is to reduce or eliminate signal interference. Circuitry and transmission lines for providing high-speed communications between writing devices and receiving devices are well known in the art and are the subject of many patents.

In most cases, even when a circuit is designed to operate at a high data transmission rate, the transmission time (i.e., the length of time required for the pulse to propagate from the writer to the head) is greater than the pulse width. In these cases, there are no circuit design considerations relating to intra-pulse characteristics; the pulse is transmitted and received in an intact form. However, when a circuit is being operated at such a high speed that the transmission time is less than (or even nearly equal to) the pulse width, the circuit designer must take several intra-pulse characteristics into account, such as the rise time and fall time of the pulse and the wave propagation characteristics of the transmission line. In particular, if the voltage polarity at the writer (transmitter) changes before the previously transmitted pulse has been received at the head (receiver), then the previously transmitted pulse may be severely distorted before it is received, and the data quality may be degraded. Thus, a dilemma for writing to a hard disk drive via a high speed channel is presented.

SUMMARY OF THE INVENTION

The present invention is intended to overcome the problems noted above when the propagation time for a pulse is less than the pulse width, and provides a preamplifier writer system for a high-speed channel that preserves the integrity of transmitted pulses.

In one aspect, the invention provides a circuit for writing to a read channel for a hard disk drive. The circuit may include a preamplifier writer, a non-uniform transmission line, and a head. The writer may be configured to transmit pulses having a pulse width to the head via the transmission line at a transmission speed. Each pulse may experience interference. The writer may also be configured to eliminate interference to each pulse by transmitting the pulses in a differential mode, causing the interference to be reduced. A transmission time for each pulse is inversely proportional to the transmission speed. In one aspect, the non-uniformity of the transmission line is attained by exponential broadening of a trace width of the transmission line. In another aspect, the transmission line non-uniformity is selected so that when the pulse width is greater than or approximately equal to the transmission time, the pulse propagates from the preamplifier writer to the head substantially undistorted.

BRIEF DESCRIPTION OF THE DRAWINGS

FIG. 1 shows a basic circuit architecture for a preamplifier writer to a hard disk drive.

FIG. 2 shows a more detailed circuit diagram for the preamplifier writer of FIG. 1.

FIG. 3 shows a series of on-off profiles for switches used in the preamplifier writer circuitry of FIG. 2.

FIG. 4 shows a simplified circuit diagram illustrating steady state operation of the preamplifier writer.

FIG. 5 shows a basic RL circuit and the voltage and current effects upon an RL circuit when a step voltage is applied.

FIG. 6 illustrates a transition caused by applying a step voltage in order to change the direction of a current through an inductor in the preamplifier writer.

FIG. 7 shows a simplified circuit diagram illustrating the resulting steady state operation of the preamplifier writer after the transition of FIG. 6 occurs.

FIG. 8 shows a model circuit diagram for a non-uniform transmission line.

FIG. 9 illustrates an effect of reflecting voltages due to mismatched impedances along a non-uniform transmission line.

FIG. 10 shows a circuit diagram for a preamplifier writer including a load resistor across the load inductor.

FIG. 11 shows a circuit diagram for a preamplifier writer according to the present invention including two matching pairs of non-uniform transmission lines.

FIG. 12 illustrates a relationship between impedance profile, decay rate, and circuit efficiency for a preamplifier writer according to the present invention.

DETAILED DESCRIPTION OF THE INVENTION

The present invention addresses the need for innovative circuit design characteristics to be implemented in high-speed channels, such as a read channel of a hard disk drive, when the transmission time of a pulse exceeds or approximately equals the pulse width. In the development of the present invention, the inventors have recognized that the physical characteristics of the transmission line can be chosen to effect various wave propagation effects.

Referring to FIG. 1, the basic architecture 100 of a preamplifier writer 105 to a recording head 110 of a hard disk drive is shown. The head 110 is modeled by an inductor. A channel is modeled by two pairs of non-uniform transmission lines 115 that are connected between the writer 105 and the head 110 in parallel. The transmission lines 115 are non-uniform in the sense that they each have a variable impedance. A 5-V power supply to the writer is modeled by a +2.5 V terminal 120 and a −2.5 V terminal 125; a third terminal 130 is connected to electrical ground.

Referring to FIG. 2, the circuitry of the writer 105 includes the terminals 120, 125, 130, and switches $S_1$ 205, $S_1'$ 210, $S_2$ 215, $S_2'$ 220, and $S_3$ 225. Referring also to FIG. 3, it is assumed that when the circuit 100 operates in a steady state, switches $S_3$ 225 and $S_1'$ 210 are on, and nodes a 230, b 235, $a_{out}$ 240, and $b_{out}$ 245 are all at ground. Current I is flowing through inductor L 110. Although the non-uniform transmission lines 115 are still employed, they behave like standard (uniform) transmission lines because at steady state, there are no transient pulse effects, and therefore the non-uniformities of the transmission lines do not affect the circuit operation. A simplified circuit diagram of the steady-state operation is shown in FIG. 4.

Next, it is assumed that it is desired to change the direction of the current I through the inductor L 110 (and therefore, the circuit will temporarily not operate in the steady state). Referring to FIG. 3, the switches $S_3$ and $S_1'$ open (i.e., they change from on to off), and switch $S_2$ closes briefly (i.e., it changes from off to on). Then, switch $S_2$ opens and switches $S_3$ and $S_2'$ close. Thus, in effect, the end result is a new steady state operation in which $S_3$ and $S_2'$ are on instead of $S_3$ and $S_1'$ being on; in other words, the current direction has been reversed.

By using a paired transmission line 115 and placing each switch $S_1$, $S_1'$, $S_2$, and $S_2'$ opposite its respective paired switch with respect to the voltage polarities and current sources, a differential mode is introduced to the circuit. Thus, any interference that is added to the input signal as a result of the switching operation described above is also added negatively on the other side of the circuit. For example, referring to FIG. 2, any interference that is added to the signal that is observable at node a 230 must also be added negatively to the signal that is observable at node b 235. Thus, when the paired input signal finally arrives at the head 110, the interference additively cancels itself out.

Referring to FIG. 6, the operation of the circuit during the transition from I=−50 mA to I=+50 mA is illustrated. The voltage of node a 230 shifts from ground (0 V) to −2.5 V, and the voltage of node b 235 shifts from ground to +2.5 V. The inductor L 110 acts like an open circuit. Once the voltage transient is completed, nodes a 230 and b 235 will decay back to ground with time constant=L/R. By choosing a small value of R, the decay is small, and the nodes a and b rapidly return to ground. It is noted that at all times, the voltage at node a 230 is exactly equal to the negative (i.e., the additive inverse) of the voltage at node b 235. The resulting steady state circuit is shown in FIG. 7.

The basic equation that relates voltage and current across an inductor is $$V = L*(di/dt). \qquad \text{(Equation 1)}$$

Therefore, if the current direction changes very rapidly, a high value of voltage will result. This may result in damage to a semiconductor chip on which the circuit is built. Therefore, care must be taken to ensure that the voltage does not exceed the maximum that the chip can withstand.

Equation 1 can be rewritten mathematically as follows:

$$\Delta I = (1/L)*\int^t V\,dt. \qquad \text{(Equation 2)}$$

Referring to FIG. 5, the voltage function V(t) 505 can be assumed to be a constant voltage $V_s$ for a duration $T_P$. Using this assumption, Equation 2 simplifies to $$\Delta I = (1/L)*V_s T_P. \qquad \text{(Equation 3)}$$

If a conventional approach is attempted for a high-speed implementation of a writer for a hard disk drive, the following exemplary values may be used: Channel speed (data rate)=2 GHz; L=60 nH; ΔI=100 mA (from −50 mA to +50 mA); and $T_P$=250 ps. Therefore, $V_s$= 24 V, which exceeds the maximum voltage for the chip. Thus, an alternative approach to increasing the data rate is required.

The ability to increase the data rate is determined by the ability to more quickly change the direction of the current across the inductor L 110. This results in a higher voltage $V_s$, but the voltage is limited by the semiconductor chip characteristics. Therefore, an alternative method of changing the current direction more quickly is sought. The approach taken by the present inventors is to use a non-uniform transmission line 115. Referring to FIG. 8, a simple model of a non-uniform transmission line 800 includes a voltage source 805, a source resistor 810 having resistance=$R_s$, a series of three impedances $Z_1$ 815, $Z_2$ 820, and $Z_3$ 825, and a load resistor 830 having resistance=$R_L$. The series of three impedances 815, 820, 825 represents a cascade of three separate uniform transmission lines. The voltage at a point between $R_s$ 810 and $Z_1$ 815 is designated $V_1$; the voltage at a point between $Z_1$ 815 and $Z_2$ 820 is designated $V_2$; the voltage at a point between $Z_2$ 820 and $Z_3$ 825 is designated $V_3$; and the output voltage across $R_L$ 830 is designated $V_o$.

The voltages $V_1$, $V_2$, $V_3$, and $V_o$ can be calculated as functions of $R_s$, $Z_1$, $Z_2$, $Z_3$, and $R_L$. Assuming that the voltage source 805 provides a step voltage having magnitude equal to $V_{in}$=1 V, then by using Ohm's law, it is seen that $V_1$=$Z_1/(Z_1+R_s)$, and the voltage $V_1$ drops across $Z_1$. Referring also to FIG. 9, once this voltage reaches the boundary 905 between $Z_1$ and $Z_2$, part of it reflects back due to the mismatched impedances. By setting $Z_2 > Z_1$, the governing equations for the reflection phenomenon are $$V_{1r} = V_1 * (Z_2 - Z_1)/(Z_2 + Z_1) \qquad \text{(Equation 4)}$$

$$\text{and } V_2 = V_1 * 2Z_2/(Z_2 + Z_1). \qquad \text{(Equation 5)}$$

Therefore, by setting $R_L > Z_3 > Z_2 > Z_1 > R_s$, a similar set of transfer functions can be derived for $V_2$, $V_3$, and $V_o$.

By maximizing the voltage $V_o$, the rate at which the current direction can be changed will also be maximized, and therefore the data rate will also be maximized. Maximizing the voltage $V_o$ is accomplished by maximizing the transfer function shown in Equation 5. Furthermore, rather than using a cascade of only three impedances, the number of impedances being cascaded can be increased infinitely. The result of maximizing this transfer function using an infinite cascade of impedances is that a maximum value of $V_o$ is realized by exponentially increasing the impedance Z as a function of transmission line length l. Impedance profiles other than exponential, for example, a binomial sequence or a Chebyshev sequence, also provide comparable gain and may be preferable due to other practical considerations such as the decay rate of the input pulse (see discussion below). All such alternatives are included within the scope of the present invention.

One embodiment of the non-uniform transmission line may be implemented as a trace on a circuit board having a constant depth. Because impedance Z is directly proportional to each of the three spatial dimensions (i.e., length, depth, and width of the trace), an exponential increase in the impedance Z as a function of length can be implemented simply by exponentially increasing the width of the trace. This results in a horn-shaped transmission line. The governing equation for the maximized $V_o$ is $$V_o = 0.5 * V_{in} * (R_L/R_s)^{1/2}. \qquad \text{(Equation 6)}$$

Alternative implementations of the non-uniform transmission line include increasing the width of the trace in the circuit board according to sequences other than an exponential sequence, such as a piecewise linear sequence, a binomial sequence or a Chebyshev sequence. Other alternatives include varying the depth of the trace according to some sequential function, or varying both trace depth and trace width.

Referring to FIG. 10, the above described process results in a circuit that maximizes the load voltage $V_o$ across the inductor L 110. However, there will also be a resistance $R_L$ 1005 that is the equivalent parallel resistance to the inductor L 110, and it may be difficult to precisely ascertain the magnitude of the resistance $R_L$. This may cause ringing in the circuit.

Referring to FIG. 11, another embodiment of the invention includes a preamplifier writer that operates similarly as the writer described above with reference to FIG. 2, and a recording head that is modeled by the inductor 110. The embodiment also includes two identical pairs of non-uniform transmission lines 115 for communications between the writer and the recording head. The non-uniformities are implemented by an exponentially widening trace in a circuit board. The use of two separate pairs of transmission lines ensures that a signal that propagates along either transmission line pair will see a matched impedance at the recording head, thereby eliminating any problem of ringing that would be caused by a mismatched load impedance.

In the absence of a second pair of transmission lines, the magnitude of the ringing problem is a function of the degree to which the output impedance of the transmission line is mismatched with the equivalent parallel resistance 1005 of the inductor 110. However, the equivalent parallel resistance 1005 is not directly measurable. Therefore, if the degree of mismatch is large, for example, if the output impedance of the transmission line $Z_L$ =100 Ω and the resistance 1005 $R_L$=1000 Ω, the embodiment shown in FIG. 11 would be preferable. However, if the degree of mismatch is not large, for example, if $Z_L$=100 Ω and $R_L$=120 Ω, the embodiment shown in FIG. 10 without the second pair of transmission lines would be preferable, because otherwise the gain realized by the circuit would be reduced by an unnecessary parallel load.

As an example of an impedance profile, suppose that the impedance at the beginning of the non-uniform transmission line is set to $Z_s$=5 Ω and the impedance at the end of the line is set to $Z_L$=100 Ω, and the impedance Z increases exponentially as a function of length. Setting $V_{in}$=5 V as shown in FIG. 1 and applying Equation 6, a result of $V_o$= 11.18 V is obtained; this represents a gain factor of about 2.2, which translates directly to an increase in maximum operating speed of the circuit.

Another circuit design consideration is the pulse width $T_P$. Referring to FIG. 12, using a step function as an input voltage, Equation 6 provides an expression for the output voltage: $V_o$=0.5*$V_{in}$*$(R_L/R_s)^{1/2}$. However, the output voltage will immediately begin to decay to $V_{decay}$=$V_{in}$*$R_L$/ $(R_L+R_s)$ (Equation 7). The difference between $V_0$ and $V_{decay}$ equates to an "overshoot" that occurs at the pulse transitions, and the magnitude of the overshoot directly affects the circuit efficiency. The rate of decay is dependent upon the impedance profile of the non-uniform transmission line. It has been found that for optimum performance, the pulse width $T_P$ should be chosen such that it is less than 90% of the time required for the output voltage from $V_o$ to $V_{decay}$. However, the pulse width $T_P$ is also directly proportional to the change in current ΔI. Hence, a wider pulse width $T_P$ results in a more efficient circuit (i.e., less overshoot). Therefore, the pulse width $T_P$ should be maximized within the decay rate criterion described above, and the decay rate is a design consideration affecting the choice of impedance profile for the non-uniform transmission lines.

While the present invention has been described with respect to what is presently considered to be the preferred embodiments, i.e., an implementation in a hard disk drive, it is to be understood that the invention is not limited to the disclosed embodiments. To the contrary, the invention is intended to cover various modifications and equivalent arrangements included within the spirit and scope of the appended claims. For example, it is to be understood that the invention is applicable to other data transmission circuitry such as optical and magnetic read circuits, cellular telephony, and digital electronic transmitters and receivers. The scope of the following claims is to be accorded the broadest interpretation so as to encompass all such modifications and equivalent structures and functions.

What is claimed is:

1. A high-speed transmission circuit, comprising:
   an inductive head; and
   a non-uniform transmission line having a variable characteristic impedance,
      wherein the non-uniform transmission line is coupled between the inductive head and an endpoint node such that pulses are conducted over the non-uniform transmission line, and
      wherein the variable characteristic impedance is greater near the inductive head than near the endpoint node.

2. The high-speed transmission circuit of claim 1, wherein the variable characteristic impedance comprises an impedance profile selected from the group consisting of exponentially increasing, binomial sequence, and Chebyshev sequence.

3. The high-speed transmission circuit of claim 1, wherein the non-uniform transmission line comprises a trace width that increases from the endpoint node to the inductive head such that the variable characteristic impedance increases from the endpoint node to the inductive head.

4. The high-speed transmission circuit of claim 3, wherein the trace width exponentially increases in width from the endpoint node to the inductive head.

5. The high-speed transmission circuit of claim 3, wherein the trace width is varied so that a pulse having a pulse width that is at least equal to a transmission time of the pulse propagates from the endpoint node to the inductive head substantially undistorted.

6. The high-speed transmission circuit of claim 5, wherein the transmission time for each pulse is inversely proportional to the transmission speed for each pulse.

7. The high-speed transmission circuit of claim 1, wherein the non-uniform transmission line comprises at least two uniform transmission lines coupled in series,
wherein a first one of the at least two uniform transmission lines is coupled to the endpoint node and comprises a first characteristic impedance,
wherein a last one of the at least two uniform transmission lines is coupled to the inductive head and comprises a last characteristic impedance, and
wherein the last characteristic impedance is greater than the first characteristic impedance.

8. The circuit of claim 7, wherein the at least two uniform transmission lines comprise a third uniform transmission line coupled between the first one and the last one of the at least two uniform transmission lines, and
wherein the third uniform transmission line comprises a third characteristic impedance greater than the first characteristic impedance and less than the last characteristic impedance.

9. The circuit of claim 1, wherein the non-uniform transmission line comprises a first transmission line comprising a first variable characteristic impedance coupled between the endpoint node and the inductive head, and a second transmission line comprising a second variable characteristic impedance coupled between the endpoint node and the inductive head,
wherein the first variable characteristic impedance is substantially equal to the second variable characteristic impedance.

10. A high-speed transmission circuit, comprising:
an inductive head;
a first transmission line comprising a first variable characteristic impedance coupled between an endpoint node and the inductive head,
wherein the first variable characteristic impedance is greater near the inductive head than near the endpoint node; and
a second transmission line comprising a second variable characteristic impedance coupled between an endpoint node and the inductive head,
wherein the second variable characteristic impedance is greater near the inductive head than near the endpoint node.

11. The high-speed transmission circuit of claim 10, wherein the first variable characteristic impedance is substantially equal to the second variable characteristic impedance.

12. The high-speed transmission circuit of claim 10, wherein the first variable characteristic impedance and the second variable characteristic impedance each comprise an impedance profile selected from the group consisting of exponentially increasing, binomial sequence, and Chebyshev sequence.

13. The high-speed transmission circuit of claim 12, wherein the first variable characteristic impedance is substantially equal to the second variable characteristic impedance.

14. The high-speed transmission circuit of claim 10, wherein the first transmission line and the second transmission line each comprise a trace width that increases from the endpoint node to the inductive head such that the first variable characteristic impedance and the second variable characteristic impedance each increases from the endpoint node to the inductive head.

15. The high-speed transmission circuit of claim 14, wherein the first transmission line trace width and the second transmission line trace width each increases exponentially in width from the endpoint node to the inductive head.

16. The high-speed transmission circuit of claim 14, wherein the first transmission line trace width and the second transmission line trace width are each varied so that a pulse having a pulse width that is at least equal to a transmission time of the pulse propagates from the endpoint node to the inductive head substantially undistorted.

17. The high-speed transmission circuit of claim 16, wherein the transmission time for each pulse is inversely proportional to a transmission speed for each pulse.

18. The high-speed transmission circuit of claim 10, wherein the first transmission line and the second transmission line each comprises at least two uniform transmission lines coupled in series,
wherein a first one of the at least two uniform transmission lines is coupled to the endpoint node and comprises a first characteristic impedance,
wherein a last one of the at least two uniform transmission lines is coupled to the inductive head and comprises a last characteristic impedance, and
wherein the last characteristic impedance is greater than the first characteristic impedance.

19. The high-speed transmission circuit of claim 18, wherein the at least two uniform transmission lines comprise a third uniform transmission line coupled between the first one and the last one of the at least two uniform transmission lines, and
wherein the third uniform transmission line comprises a third characteristic impedance greater than the first characteristic impedance and less than the last characteristic impedance.

20. A high-speed transmission circuit, comprising:
an inductive head; and
means for conducting pulses between an endpoint node and the inductive head,
wherein the means for conducting comprising a variable characteristic impedance, and
wherein the variable characteristic impedance is greater near the inductive head than near the endpoint node.

21. The high-speed transmission circuit of claim 20, wherein the variable characteristic impedance comprises an impedance profile selected from the group consisting of exponentially increasing, binomial sequence, and Chebyshev sequence.

22. The high-speed transmission circuit of claim 20, wherein the means for conducting comprises a trace width that increases from the endpoint node to the inductive head such that the variable characteristic impedance increases from the endpoint node to the inductive head.

23. The high-speed transmission circuit of claim 22, wherein the trace width exponentially increases in width from the endpoint node to the inductive head.

24. The high-speed transmission circuit of claim 22, wherein the trace width is varied so that a pulse having a pulse width that is at least equal to a transmission time of the pulse propagates from the endpoint node to the inductive head substantially undistorted.

25. The high-speed transmission circuit of claim 24, wherein the transmission time for each pulse is inversely proportional to a transmission speed for each pulse.

26. The high-speed transmission circuit of claim 20, wherein the means for conducting comprises at least two uniform transmission lines coupled in series,
   wherein a first one of the at least two uniform transmission lines is coupled to the endpoint node and comprises a first characteristic impedance,
   wherein a last one of the at least two uniform transmission lines is coupled to the inductive head and comprises a last characteristic impedance, and
   wherein the last characteristic impedance being is greater than the first characteristic impedance.

27. The high-speed transmission circuit of claim 26, wherein the at least two uniform transmission lines comprise a third uniform transmission line coupled between the first one and the last one of the at least two uniform transmission lines, and
   wherein the third uniform transmission line comprises a third characteristic impedance greater than the first characteristic impedance and less than the last characteristic impedance.

28. The high-speed transmission circuit of claim 20, wherein the means for conducting comprises:
   a first means for conducting comprising a first variable characteristic impedance coupled between the endpoint node and the inductive head; and
   a second means for conducting comprising a second variable characteristic impedance coupled between the endpoint node and the inductive head,
      wherein the first variable characteristic impedance is substantially equal to the second variable characteristic impedance.

29. A high-speed transmission circuit, comprising:
   an inductive head;
   first means for conducting comprising a first variable characteristic impedance,
      wherein the first means for conducting is coupled between an endpoint node and the inductive head,
      wherein the first variable characteristic impedance is greater near the inductive head than the near the endpoint node; and
   second means for conducting comprising a second variable characteristic impedance,
      wherein the second means for conducting is coupled between the endpoint node and the inductive head, and
      wherein the second variable characteristic impedance is greater near the inductive than near the endpoint node.

30. The high-speed transmission circuit of claim 29, wherein the first variable characteristic impedance is substantially equal to the second variable characteristic impedance.

31. The high-speed transmission circuit of claim 29, wherein the first variable characteristic impedance and the second variable characteristic impedance each comprise an impedance profile selected from the group consisting of exponentially increasing, binomial sequence, and Chebyshev sequence.

32. The high-speed transmission circuit of claim 31, wherein the first variable characteristic impedance is substantially equal to the second variable characteristic impedance.

33. The high-speed transmission circuit of claim 30, wherein the first means for conducting and the second means for conducting each comprise a trace width that increases from the endpoint node to the inductive head such that the first variable characteristic impedance and the second variable characteristic impedance each increases from the endpoint node to the inductive head.

34. The high-speed transmission circuit of claim 33, wherein the first means for conducting trace width and the second means for conducting trace width each increases exponentially in width from the endpoint node to the inductive head.

35. The high-speed transmission circuit of claim 33, wherein the first means for conducting trace width and the second means for conducting trace width are each varied so that a pulse having a pulse width that is at least equal to a transmission time of the pulse propagates from the endpoint node to the inductive head substantially undistorted.

36. The high-speed transmission circuit of claim 35, wherein the transmission time for each pulse is inversely proportional to a transmission speed for each pulse.

37. The high-speed transmission circuit of claim 30, wherein the first means for conducting and the second means for conducting each comprises at least two uniform means for conducting coupled in series,
   wherein a first one of the at least two uniform means for conducting is coupled to the endpoint node and comprises a first characteristic impedance,
   wherein a last one of the at least two uniform means for conducting is coupled to the inductive head and comprises a last characteristic impedance, and
   wherein the last characteristic impedance is greater than the first characteristic impedance.

38. The high-speed transmission circuit of claim 37, wherein the at least two uniform means for conducting comprise a third uniform means for conducting coupled between the first one and the last one of the at least two uniform means for conducting,
   wherein the third uniform means for conducting comprises a third characteristic impedance greater than the first characteristic impedance and less than the last characteristic impedance.

39. A method of high-speed transmission, comprising the steps of:
   providing a non-uniform transmission line having a variable characteristic impedance;
   arranging the variable characteristic impedance to be greater near an inductive head than near an endpoint node; and
   transmitting pulses at a transmission speed over the non-uniform transmission line to the inductive head.

40. The method of claim 39, wherein a transmission time for each pulse is inversely proportional to the transmission speed for each pulse.

41. The method of claim 39, further comprising the step of:
   setting the variable characteristic impedance to conform to an impedance profile selected from the group consisting of exponentially increasing, binomial sequence, and Chebyshev sequence.

42. The method of claim 39, wherein the non-uniform transmission line comprises a trace width, and wherein the step of providing the non-uniform transmission line comprises the step of:
increasing a trace width near the inductive head such that the variable characteristic impedance is increased near the inductive head.

43. The method of claim 42, wherein the non-uniform transmission line comprises a length, and
wherein the step of increasing the trace width comprises the step of:
exponentially increasing the trace width along the length of the non-uniform transmission line towards the inductive head.

44. The method of claim 42, further comprising the step of:
varying the trace width so that a pulse having a pulse width that is at least equal to a transmission time of the pulse propagates from the endpoint node to the inductive head substantially undistorted.

45. The method of claim 44, wherein the transmission time for each pulse is inversely proportional to a transmission speed for each pulse.

46. The method of claim 39, wherein the step of providing the non-uniform transmission line comprises the step of:
coupling at least two uniform transmission lines in series,
wherein a first one of the at least two uniform transmission lines is coupled to the endpoint node and comprises a first characteristic impedance,
wherein a last one of the at least two uniform transmission lines is coupled to the inductive head and comprises a last characteristic impedance, and
wherein the last characteristic impedance is greater than the first characteristic impedance.

47. The method of claim 46, wherein the step of coupling the at least two uniform transmission lines in series comprises the step of:
coupling a third uniform transmission line between the first one and the last one of the at least two uniform transmission lines,
wherein the third uniform transmission line comprises a third characteristic impedance greater than the first characteristic impedance and less than the last characteristic impedance.

48. The method of claim 39, wherein the step of transmitting comprises the step of:
differentially transmitting the pulses to the inductive head.

49. A circuit for high-speed transmission via a non-uniform transmission line, wherein the non-uniform transmission line includes a variable characteristic impedance, the circuit comprising:
an inductive head; and
a preamplifier writer configured to transmit pulses to the inductive head at a transmission speed,
wherein a transmission time for each pulse is inversely proportional to the transmission speed,
wherein the non-uniform transmission line is coupled between the inductive head and the preamplifier writer such that the pulses are conducted over the non-uniform transmission line, and
wherein the variable characteristic impedance is greater near the inductive head than near the preamplifier writer.

50. The circuit of claim 49, wherein the variable characteristic impedance comprises an impedance profile selected from the group consisting of exponentially increasing, binomial sequence, and Chebyshev sequence.

51. The circuit of claim 49, wherein the non-uniform transmission line comprises a trace width that increases from the preamplifier writer to the inductive head such that the variable characteristic impedance increases from the preamplifier writer to the inductive head.

52. The circuit of claim 49, wherein the trace width exponentially increases in width from the preamplifier writer to the inductive head.

53. The circuit of claim 51, wherein the trace width is varied so that a pulse having a pulse width that is at least equal to the transmission time of the pulse propagates from the preamplifier writer to the inductive head substantially undistorted.

54. The circuit of claim 49, wherein the non-uniform transmission line comprises at least two uniform transmission lines coupled in series,
wherein a first one of the at least two uniform transmission lines is coupled to the node and comprises a first characteristic impedance,
wherein a last one of the at least two uniform transmission lines is coupled to the inductive head and comprises a last characteristic impedance, and
wherein the last characteristic impedance is greater than the first characteristic impedance.

55. The circuit of claim 54, wherein the at least two uniform transmission lines comprise a third uniform transmission line coupled between the first one and the last one of the at least two uniform transmission lines, and
wherein the third uniform transmission line comprises a third characteristic impedance greater than the first characteristic impedance and less than the last characteristic impedance.

56. The circuit of claim 49, wherein the preamplifier writer includes a first driver and a second driver configured to provide differential mode drive to the inductive head, and
wherein the non-uniform transmission line comprises a first transmission line comprising a first variable characteristic impedance coupled between the first driver and the inductive head, and a second transmission line comprising a second variable characteristic impedance coupled between the second driver and the inductive head, and
wherein the first variable characteristic impedance is substantially equal to the second variable characteristic impedance.

57. A circuit for high-speed transmission via a non-uniform transmission line, wherein the non-uniform transmission line comprises a first transmission line and a second transmission line, wherein the first transmission line comprises a first variable characteristic impedance and the second transmission line comprises a second variable characteristic impedance, the circuit comprising:
an inductive head; and
a preamplifier writer configured to transmit pulses to the inductive head at a transmission speed,
wherein a transmission time for each pulse is inversely proportional to the transmission speed,
wherein the preamplifier writer includes a first driver and a second driver configured to provide differential mode drive to the inductive head,
wherein the first transmission line is coupled between the first driver and the inductive head,
wherein the first variable characteristic impedance is greater near the inductive head than near the first driver,
wherein the second transmission line is coupled between the second driver and the inductive head, and wherein the second variable characteristic impedance is greater near the inductive head than near the second driver.

58. The circuit of claim 57, wherein the first variable characteristic impedance is substantially equal to the second variable characteristic impedance.

59. The circuit of claim 57, wherein the first variable impedance characteristic and the second variable impedance characteristic each comprise an impedance profile selected from the group consisting of exponentially increasing, binomial sequence, and Chebyshev sequence.

60. The circuit of claim 59, wherein the first variable characteristic impedance is substantially equal to the second variable characteristic impedance.

61. The circuit of claim 57, wherein the first transmission line and the second transmission line each comprise a trace width that increases from the preamplifier writer to the inductive head such that the first variable characteristic impedance and the second variable characteristic impedance each increases from the preamplifier writer to the inductive head.

62. The circuit of claim 61, wherein the first transmission line trace width and the second transmission line trace width each increases exponentially in width from the preamplifier writer to the inductive head.

63. The circuit of claim 61, wherein first transmission line trace width and the second transmission line trace width are each varied so that a pulse having a pulse width that is at least equal to the transmission time of the pulse propagates from the preamplifier writer to the inductive head substantially undistorted.

64. The circuit of claim 58, wherein the first transmission line and the second transmission line each comprises at least two uniform transmission lines coupled in series,
    wherein a first one of the at least two uniform transmission lines is coupled to the preamplifier writer and comprises a first characteristic impedance,
    wherein a last one of the at least two uniform transmission lines is coupled to the inductive head and comprises a last characteristic impedance, and
    wherein the last characteristic impedance is greater than the first characteristic impedance.

65. The circuit of claim 64, wherein the at least two uniform transmission lines comprise a third uniform transmission line coupled between the first one and the last one of the at least two uniform transmission lines, and
    wherein the third uniform transmission line comprises a third characteristic impedance greater than the first characteristic impedance and less than the last characteristic impedance.

66. A circuit for high-speed transmission via a non-uniform transmission line, wherein the non-uniform transmission line includes a variable characteristic impedance, the circuit comprising:
    an inductive head; and
    means for transmitting pulses to the inductive head at a transmission speed,
        wherein a transmission time for each pulse is inversely proportional to the transmission speed,
        wherein the non-uniform transmission line is coupled between the means for transmitting and the inductive head, and
        wherein the variable characteristic impedance is greater near the inductive head than near the means for transmitting.

67. The circuit of claim 66, wherein the variable characteristic impedance comprises an impedance profile selected from the group consisting of exponentially increasing, binomial sequence, and Chebyshev sequence.

68. The circuit of claim 66, wherein the non-uniform transmission line comprises a trace width that increases from the means for transmitting to the inductive head such that the variable characteristic impedance increases from the means for transmitting to the inductive head.

69. The circuit of claim 68, wherein the trace width exponentially increases in width from the means for transmitting to the inductive head.

70. The circuit of claim 68, wherein the trace width is varied so that a pulse having a pulse width that is at least equal to the transmission time of the pulse propagates from the means for transmitting to the inductive head substantially undistorted.

71. The circuit of claim 66, wherein the non-uniform transmission line comprises at least two uniform transmission lines coupled in series,
    wherein a first one of the at least two uniform transmission lines is coupled to the means for transmitting and comprises a first characteristic impedance,
    wherein a last one of the at least two uniform transmission lines is coupled to the inductive head and comprises a last characteristic impedance, and
    wherein the last characteristic impedance is greater than the first characteristic impedance.

72. The circuit of claim 71, wherein the at least two uniform transmission lines comprise a third uniform transmission line coupled between the first one and the last one of the at least two uniform transmission lines, and
    wherein the third uniform transmission line comprises a third characteristic impedance greater than the first characteristic impedance and less than the last characteristic impedance.

73. The circuit of claim 66, wherein the means for transmitting comprises a first driver means and a second driver means configured to provide differential mode drive to the inductive head,
    wherein the non-uniform transmission line comprises a first transmission line comprising a first variable characteristic impedance coupled between the first driver means and the inductive head, and a second transmission line comprising a second variable characteristic impedance coupled between the second driver means and the inductive head, and
    wherein the first variable characteristic impedance is substantially equal to the second variable characteristic impedance.

74. A circuit for high-speed transmission via a non-uniform transmission line, wherein the non-uniform transmission line comprises a first means for conducting and a second means for conducting, wherein the first means for conducting comprises a first variable characteristic impedance and the second means for conducting comprises a second variable characteristic impedance, the circuit comprising:
    an inductive head; and
    means for transmitting configured to transmit pulses to the inductive head at a transmission speed,
        wherein a transmission time for each pulse is inversely proportional to the transmission speed,
        wherein the means for transmitting comprises a first driver means and a second driver means configured to provide differential mode drive to the inductive head, wherein the first means for conducting is coupled between the first driver means and the inductive head, wherein the first variable characteristic impedance is greater near the inductive head than near the first driver means, wherein the second means for conducting is coupled between the second driver means and the inductive head, and wherein the second variable characteristic impedance is greater near the inductive head than near the first driver means.

75. The circuit of claim 74, wherein the first variable characteristic impedance is substantially equal to the second variable characteristic impedance.

76. The circuit of claim 74, wherein the first variable characteristic impedance and the second variable characteristic impedance each comprise an impedance profile selected from the group consisting of exponentially increasing, binomial sequence, and Chebyshev sequence.

77. The circuit of claim 76, wherein the first variable characteristic impedance is substantially equal to the second variable characteristic impedance.

78. The circuit of claim 74, wherein the first means for conducting and the second means for conducting each comprise a trace width that increases from the means for transmitting to the inductive head such that the first variable characteristic impedance and the second variable characteristic impedance each increases from the means for transmitting to the inductive head.

79. The circuit of claim 78, wherein the first means for conducting trace width and the second means for conducting trace width each increases exponentially in width from the means for transmitting to the inductive head.

80. The circuit of claim 78, wherein first means for conducting trace width and the second means for conducting trace width are each varied so that a pulse having a pulse width that is at least equal to the transmission time of the pulse propagates from the means for transmitting to the inductive head substantially undistorted.

81. The circuit of claim 74, wherein the first means for conducting and the second means for conducting each comprises at least two uniform means for conducting coupled in series, wherein a first one of the at least two uniform means for conducting is coupled to the means for transmitting and comprises a first characteristic impedance, wherein a last one of the at least two uniform means for conducting is coupled to the inductive head and comprises a last characteristic impedance, and wherein the last characteristic impedance is greater than the first characteristic impedance.

82. The circuit of claim 81, wherein the at least two uniform means for conducting comprises a third uniform means for conducting coupled between the first one and the last one of the at least two uniform means for conducting, and wherein the third uniform means for conducting comprises a third characteristic impedance greater than the first characteristic impedance and less than the last characteristic impedance.

83. A method of high-speed transmission via a non-uniform transmission line, wherein the non-uniform transmission line includes a variable characteristic impedance, the method comprising the steps of:

arranging the variable characteristic impedance to be greater near an inductive head than near a means for transmitting; and transmitting pulses at a transmission speed over the non-uniform transmission line to the inductive head, wherein a transmission time for each pulse is inversely proportional to the transmission speed.

84. The method of claim 83, further comprising the step of:

setting the variable characteristic impedance to conform to an impedance profile selected from the group consisting of exponentially increasing, binomial sequence, and Chebyshev sequence.

85. The method of claim 83, wherein the non-uniform transmission line comprises a trace width, and wherein the method further comprises the step of:

increasing the trace width near the inductive head such that the variable characteristic impedance is increased near the inductive head.

86. The method of claim 85, wherein the non-uniform transmission line comprises a length, and wherein the step of increasing the trace width comprises the step of:

exponentially increasing the trace width along the length of the non-uniform transmission line towards the inductive head.

87. The method of claim 85, further comprising the step of:

varying the trace width so that a pulse having a pulse width that is at least equal to the transmission time of the pulse propagates from the means for transmitting to the inductive head substantially undistorted.

88. The method of claim 83, further comprising the step of:

coupling at least two uniform transmission lines in series, wherein a first one of the at least two uniform transmission lines is coupled to the means for transmitting and comprises a first characteristic impedance, wherein a last one of the at least two uniform transmission lines is coupled to the inductive head and comprises a last characteristic impedance, and wherein the last characteristic impedance is greater than the first characteristic impedance.

89. The method of claim 88, wherein the step of coupling the at least two uniform transmission lines in series comprises the step of:

coupling a third uniform transmission line between the first one and the last one of the at least two uniform transmission lines, wherein the third uniform transmission line comprises a third characteristic impedance greater than the first characteristic impedance and less than the last characteristic impedance.

90. The method of claim 83, wherein the step of transmitting comprises the step of:

differentially transmitting the pulses to the inductive head.

* * * * *

UNITED STATES PATENT AND TRADEMARK OFFICE
CERTIFICATE OF CORRECTION

PATENT NO. : 6,987,634 B1
APPLICATION NO. : 10/921810
DATED : January 17, 2006
INVENTOR(S) : Aram et al.

Page 1 of 1

It is certified that error appears in the above-identified patent and that said Letters Patent is hereby corrected as shown below:

Claim 29, Line 48:   Delete "the" after "than"
Claim 29, Line 57:   Insert -- head -- after "inductive"

Signed and Sealed this

Nineteenth Day of September, 2006

JON W. DUDAS
*Director of the United States Patent and Trademark Office*